US011441964B2

(12) United States Patent
Senz et al.

(10) Patent No.: US 11,441,964 B2
(45) Date of Patent: Sep. 13, 2022

(54) MICROMECHANICAL PRESSURE SENSOR DEVICE AND CORRESPONDING MANUFACTURING METHOD

(71) Applicant: Robert Bosch GmbH, Stuttgart (DE)

(72) Inventors: Volkmar Senz, Metzingen (DE); Arne Dannenberg, Metzingen (DE); Jochen Franz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 253 days.

(21) Appl. No.: 16/761,604

(22) PCT Filed: Oct. 26, 2018

(86) PCT No.: PCT/EP2018/079382
§ 371 (c)(1),
(2) Date: May 5, 2020

(87) PCT Pub. No.: WO2019/096560
PCT Pub. Date: May 23, 2019

(65) Prior Publication Data
US 2020/0326256 A1    Oct. 15, 2020

(30) Foreign Application Priority Data
Nov. 15, 2017    (DE) .......................... 102017220349.8

(51) Int. Cl.
*G01L 19/14*    (2006.01)
*B81B 7/00*    (2006.01)
(Continued)

(52) U.S. Cl.
CPC .......... *G01L 19/146* (2013.01); *B81B 7/0048* (2013.01); *B81B 2201/0264* (2013.01)

(58) Field of Classification Search
CPC .................................................. B81B 7/0048
See application file for complete search history.

(56) References Cited

U.S. PATENT DOCUMENTS

| 2013/0001710 A1 | 1/2013 | Daneman et al. |
| 2014/0217521 A1 | 8/2014 | Johari-Galle et al. |

(Continued)

FOREIGN PATENT DOCUMENTS

| CN | 106029554 A | 10/2016 |
| CN | 106185783 A | 12/2016 |

(Continued)

OTHER PUBLICATIONS

International Search Report for PCT/EP2018/079382, dated Jan. 31, 2019.

*Primary Examiner* — Omar F Mojaddedi
(74) *Attorney, Agent, or Firm* — Norton Rose Fulbright US LLP; Gerard Messina

(57) ABSTRACT

A micromechanical pressure sensor device is equipped with a sensor substrate including a front side and a rear side. The device includes a pressure sensor unit suspended in the sensor substrate, a first cavity above the pressure sensor unit, which is exposed toward the front side via one or multiple access openings, one or multiple stress relief trenches, which laterally enclose the pressure sensor unit and form a fluidic connection from the rear side to the first cavity, and a circuit substrate, on which the rear side of the sensor substrate is bonded. A second cavity, which is in fluidic connection with the stress relief trenches, is formed below the pressure sensor unit in the circuit substrate. At least one channel is provided in a periphery of the pressure sensor unit, which is in fluidic connection with the second cavity and is exposed to the outside.

9 Claims, 3 Drawing Sheets

(51) Int. Cl.
*G01L 9/00* (2006.01)
*G01L 19/06* (2006.01)
*G01L 19/00* (2006.01)

(56) References Cited

U.S. PATENT DOCUMENTS

| | | | |
|---|---|---|---|
| 2014/0286509 A1* | 9/2014 | Sciutti | B81B 7/0029 |
| | | | 381/174 |
| 2015/0014793 A1 | 1/2015 | Yow et al. | |
| 2016/0122181 A1* | 5/2016 | Picco | B81B 7/0058 |
| | | | 257/419 |
| 2016/0272482 A1* | 9/2016 | Dawson | B81B 7/0048 |
| 2017/0291812 A1* | 10/2017 | Umetsu | B81B 7/0048 |
| 2018/0024020 A1* | 1/2018 | Stefanescu | G01L 19/145 |
| | | | 73/721 |

FOREIGN PATENT DOCUMENTS

| | | |
|---|---|---|
| CN | 205820885 U | 12/2016 |
| DE | 102010064108 A1 | 6/2012 |
| DE | 102011077686 A1 | 12/2012 |
| DE | 102012205878 A1 | 10/2013 |
| DE | 102014200512 A1 | 7/2015 |
| DE | 102015116353 A1 | 5/2016 |
| DE | 102015110351 A1 | 12/2016 |

* cited by examiner

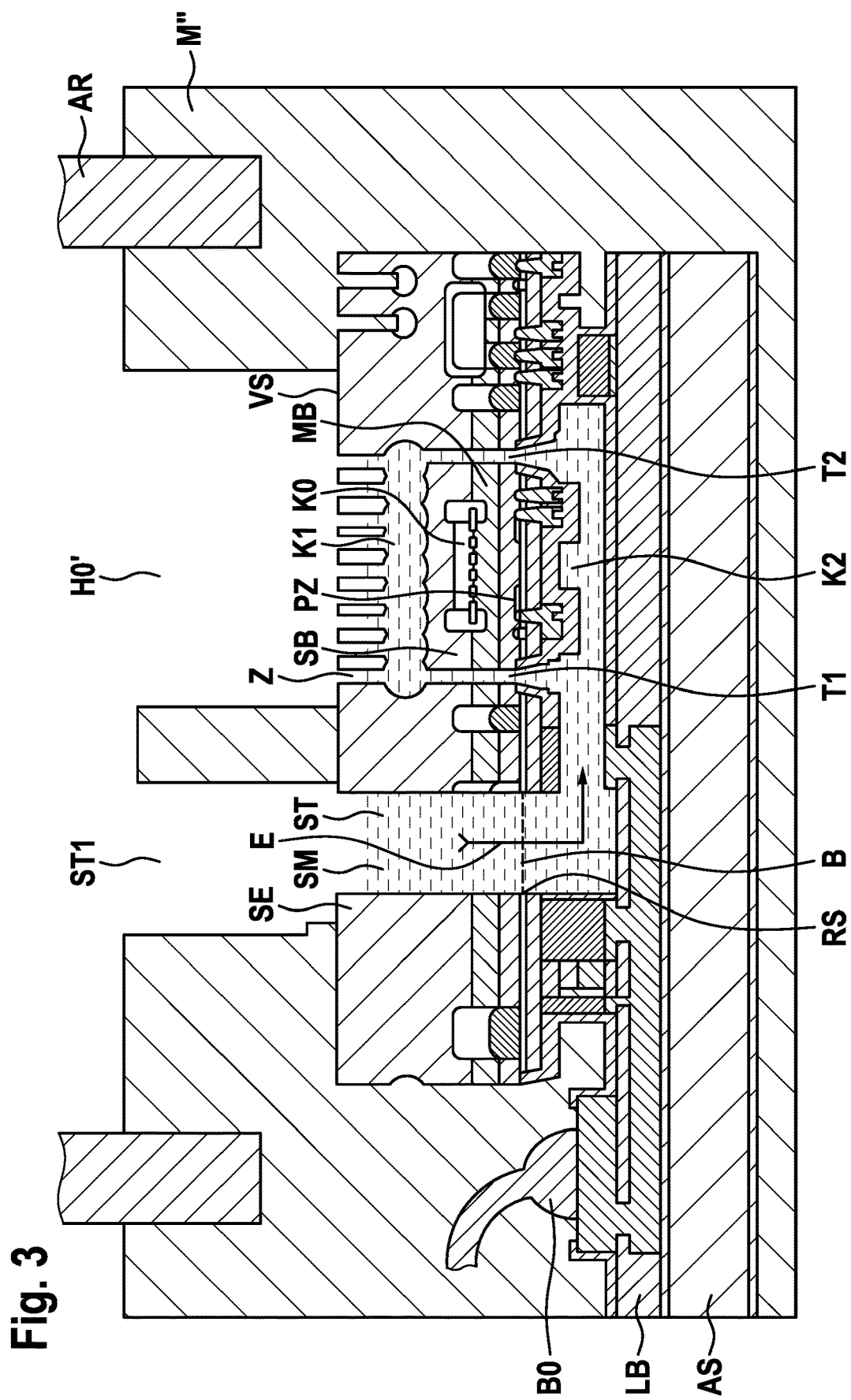

MICROMECHANICAL PRESSURE SENSOR DEVICE AND CORRESPONDING MANUFACTURING METHOD

FIELD

The present invention relates to a micromechanical pressure sensor device and a corresponding manufacturing method.

Although applicable to arbitrary micromechanical pressure sensor devices, the present invention and its underlying problem will be explained with reference to micromechanical pressure sensor devices based on silicon.

BACKGROUND INFORMATION

German Patent Application No. DE 10 2014 200 512 A1 describes a micromechanical pressure sensor device and a corresponding manufacturing method. The micromechanical pressure sensor device includes an ASIC wafer, on whose front side a rewiring unit including a plurality of stacked strip conductor levels and insulation layers is provided. Furthermore, it includes a MEMS wafer, in which a pressure sensor unit is provided, to which pressure is applicable from the front side via multiple through openings. The pressure detection takes place via a deflection of a diaphragm-like first electrode in relation to a second fixed electrode with the aid of a capacitive measuring method.

A piezoresistive pressure measuring method, in which piezoresistive semiconductor resistors are provided in or on a diaphragm of a micromechanical pressure sensor device is described, for example, in German Patent Application No. DE 10 2012 205 878 A1.

The piezoresistive semiconductor resistors, which are used in such micromechanical pressure sensor devices as mechanical-electrical transducers, not only absorb the mechanical stress which results due to the pressure influence on the diaphragm, but rather also the stress of mechanical parasitic inductions.

Various factors contribute to these parasitic inductions, for example, the deformation of the circuit board on which the pressure sensor device is installed, a deformation of the package via the temperature, for example, due to soldering, a temperature behavior of the adhesive used, a temperature behavior of the cover layers of the pressure sensor device, etc.

Therefore, a mechanical decoupling of the core of the pressure sensor device has been provided. Existing approaches for this purpose are lateral free trenching of the diaphragm or free etching of the diaphragm on all sides, typically multiple connections to the chip edge remaining in order to implement electrical connections to the diaphragm.

German Patent Application No. DE 10 2015 116 353 A1 describes a micromechanical pressure sensor device having mechanical decoupling and a corresponding manufacturing method. The pressure sensor area manufactured on an SOI substrate is exposed from the rear side by etching out a buried oxide layer.

A media resistance of a micromechanical pressure sensor device may be achieved in that the sensor surface is filled using a gel, which has media-resistant properties, as described, for example, in German Patent Application No. DE 10 2011 077 686 A1. However, bubbles may not be contained in the gel, since this worsens the performance of the pressure sensor device.

SUMMARY

The present invention provides a micromechanical pressure sensor device and a corresponding manufacturing method.

Preferred refinements of the present invention are described herein.

In accordance with the present invention, a separate channel is provided in the periphery of the pressure sensor unit, which preferably has a larger diameter than the access openings above the pressure sensor device and the laterally surrounding stress relief trenches. A bubble-free filling of the pressure sensor unit using a passivation medium, for example, a gel or its uncured precursor, via the channel is thus greatly simplified.

According to one preferred refinement of the present invention, the channel, the second cavity, the stress relief trenches, and the first cavity are filled using a passivation medium. An effective media resistance may thus be achieved.

According to a further preferred refinement of the present invention, the sensor substrate and the circuit substrate are at least partially enclosed by a mold housing, which includes a first through opening, which exposes the channel and access openings. It may thus largely protect substrates from external influences.

According to a further preferred refinement of the present invention, the sensor substrate and the circuit substrate are at least partially enclosed by a mold housing, which includes a first through opening, which exposes the access openings, and which includes a second through opening, which exposes the channel. The filling may thus take place via the mold housing.

According to a further preferred refinement of the present invention, a mounting flange is molded into the mold housing or is adhesively bonded onto the mold housing on a side of the mold housing facing away from the sensor substrate. An easily sealable connection to an external housing may thus be carried out.

According to a further preferred refinement of the present invention, the pressure sensor unit includes a third cavity, which is hermetically sealed and which adjoins a diaphragm area, on or in which a piezoelectric device is provided for detecting the pressure via a deformation of the diaphragm area. This ensures a robust pressure detection.

According to a further preferred refinement of the present invention, the circuit substrate includes a strip conductor unit, the second cavity being provided in the area of the strip conductor unit. This is easily implementable by providing a sacrificial layer area to be removed in the strip conductor unit.

According to a further preferred refinement of the present invention, the pressure sensor unit is suspended via strip conductors in the sensor substrate. A particularly effective mechanical decoupling of the pressure sensor unit may thus be achieved. The strip conductors may be mechanically stabilized by webs of the substrate material, for example, silicon.

BRIEF DESCRIPTION OF THE DRAWINGS

Further features and advantages of the present invention are explained hereafter on the basis of specific embodiments with reference to the figures.

FIG. 3 shows a schematic cross-sectional view of a micromechanical pressure sensor device according to a third specific embodiment of the present invention.

DETAILED DESCRIPTION OF EXAMPLE EMBODIMENTS

In the figures, identical reference signs identify identical or functionally identical elements.

Figure 1:
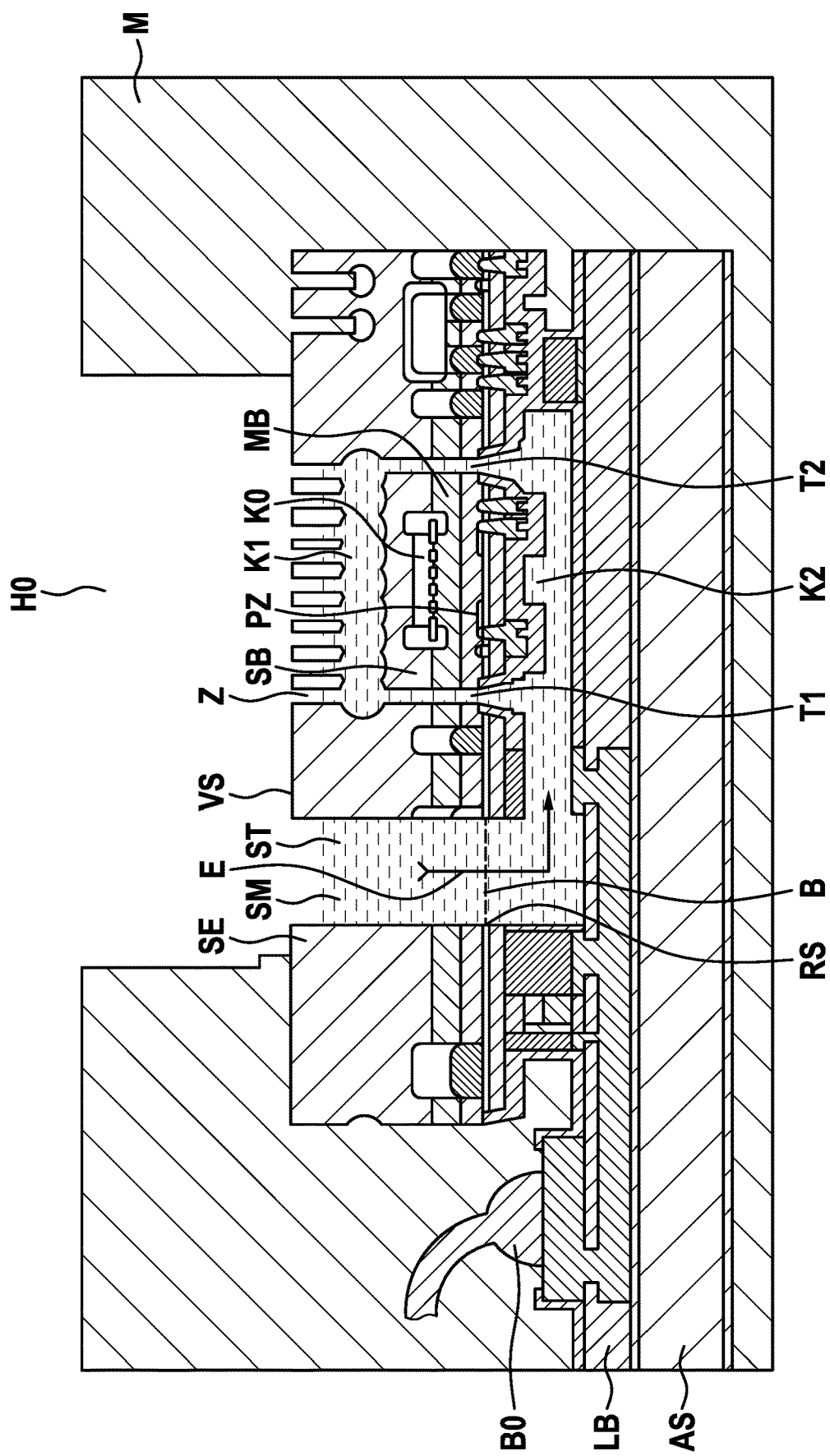
FIG. 1 shows a schematic cross-sectional view of a micromechanical pressure sensor device according to a first specific embodiment of the present invention.

FIG. 1 shows a schematic cross-sectional view of a micromechanical pressure sensor device according to a first specific embodiment of the present invention.

In FIG. 1, reference sign SE identifies a sensor substrate having a front side VS and a rear side RS. A pressure sensor unit SB is suspended in the substrate. The suspension is implemented in the present specific embodiment via strip conductors (not shown) in sensor substrate SE, but may optionally or alternatively be implemented by webs of the substrate material, for example, silicon.

A first cavity K1 is provided above pressure sensor unit SB in sensor substrate SE, which is exposed via a plurality of access openings Z toward front side VS.

Pressure sensor unit SB suspended in sensor substrate SE is enclosed by a plurality of stress relief trenches T1, T2, which laterally decouple pressure sensor unit SB from remaining sensor substrate SE and form a fluidic connection from rear side RS to first cavity K1.

A circuit substrate AS having a strip conductor unit LB, which includes a plurality of strip conductor levels and interposed insulation layers, sensor substrate SE being bonded using a rear side RS on circuit substrate AS. The dashed line identified by reference sign B identifies the bond level.

A second cavity K2, which has a fluidic connection to stress relief trenches T1, T2, is formed below pressure sensor unit SB in circuit substrate AS. This may be carried out, for example, by providing and removing a corresponding sacrificial layer area in strip conductor unit LB, for example, an oxide area. Alternatively, the cavity may be formed in that circuit substrate AS is joined to sensor substrate SE, for example, by eutectic bonding.

In a periphery of pressure sensor unit SB, a channel ST is provided, which extends from front side VS to rear side RS of sensor substrate SE and which has a fluidic connection to second cavity K2, i.e., it opens in same.

Channel ST has a relatively large diameter, which is larger than the diameter of stress relief trenches T1, T2 and access openings Z. Pressure sensor unit SB may be filled using a passivation medium SM via channel ST, the filling direction being identified by reference sign E.

Therefore, during the filling, firstly second cavity K2 is filled, and subsequently passivation medium SM propagates further through stress relief trenches T1, T2 into first cavity K1 and thereafter into access openings Z. In the present specific embodiment, filled passivation medium SM does not extend up to front side VS of sensor substrate SE, however, this may vary depending on the application, and an extension may be provided up to front side VS or beyond, or also only up to the edge of cavity K1 to access opening Z.

Sensor substrate SE and circuit substrate AS are enclosed by a mold housing M, which includes a through opening H0, which exposes channel ST and access openings Z. The filling may take place either before the molding or after the molding. Passivation medium SM is, for example, a precursor of a media-robust gel or a media-robust liquid, for example, oil. If passivation medium SM is not curable, a textile diaphragm (not shown) may be adhesively bonded on front side VS of sensor substrate SE to prevent passivation medium SM from running out.

Circuit substrate AS may be externally electrically contacted in a typical way via bond connections BO.

Although it is not restricted thereto, pressure sensor unit SB includes a third cavity K0 in the illustrated specific embodiment, which is hermetically sealed and which adjoins a diaphragm area MB, on or in which a piezoelectric unit PZ is provided for detecting the pressure via a deformation of diaphragm area MB.

Of course, a capacitive or other type of pressure sensor unit SB is also possible.

Figure 2:
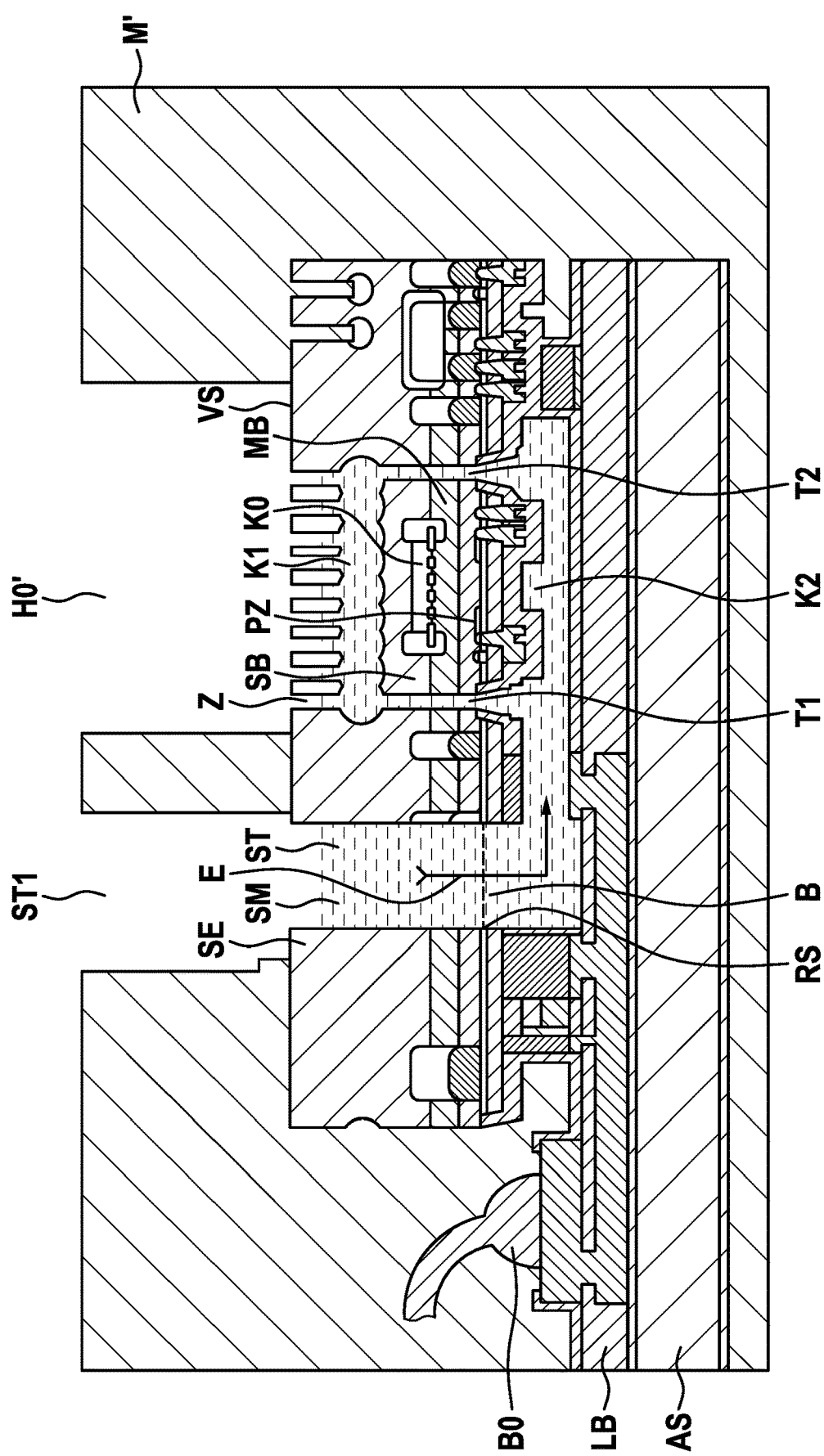
FIG. 2 shows a schematic cross-sectional view of a micromechanical pressure sensor device according to a second specific embodiment of the present invention.

FIG. 2 shows a schematic cross-sectional view of a micromechanical pressure sensor device according to a second specific embodiment of the present invention.

In the second specific embodiment, mold housing M' differs from that of the first specific embodiment. Mold housing M' includes a first through opening H0' here, which exposes access openings Z. Furthermore, a second through opening ST1 is provided, which exposes channel ST. A filler may thus be applied to mold housing M' in the case of a suitable molding tool to facilitate the filling.

Otherwise, the second specific embodiment is designed identically to the first specific embodiment.

FIG. 3 shows a schematic cross-sectional view of a micromechanical pressure sensor device according to a third specific embodiment of the present invention.

In the third specific embodiment, mold housing M" includes an mounting flange AR, which is molded into mold housing M", on the side of mold housing M" facing away from sensor substrate SE.

Mounting flange AR may by a metal ring, for example. Mounting flange AR may thus be used, for example, as a contact surface for a sealing ring (not shown), which is integrated, for example, into the housing of a smart tool (for example, a smartwatch).

In other specific embodiments (not shown), mounting flange AR may also be adhesively bonded onto mold housing M.

Although the present invention was described on the basis of preferred exemplary embodiments, it is not restricted thereto. In particular, the materials and topologies mentioned are only by way of example and are not restricted to the explained examples.

Although at least one externally exposed channel, which extends from the front side to the rear side and which has a fluidic connection to the second cavity, is provided in the illustrated specific embodiments in the periphery of the pressure sensor unit, in a further specific embodiment (not shown), the channel may extend through the circuit substrate or laterally outward.

The invention claimed is:

1. A micromechanical pressure sensor device, comprising:
   a sensor substrate including a front side and a rear side;
   a pressure sensor unit suspended in the sensor substrate;
   a first cavity situated above the pressure sensor unit, the first cavity being exposed toward the front side via one or multiple access openings;
   one or multiple stress relief trenches which laterally enclose the pressure sensor unit and form a fluidic connection from the rear side to the first cavity;
   a circuit substrate on which the rear side of the sensor substrate is bonded;

a second cavity, which is in fluidic connection with the stress relief trenches, is situated below the pressure sensor unit in the circuit substrate; and at least one channel, which is in fluidic connection with the second cavity and is exposed to the outside, is situated in a periphery of the pressure sensor unit;

wherein the circuit substrate includes a strip conductor unit, the strip conductor unit including a plurality of strip conductor levels and interposed insulation layers, and the second cavity is situated in the strip conductor unit.

2. The micromechanical pressure sensor device as recited in claim 1, wherein the channel, the second cavity, the stress relief trenches, and the first cavity, are filled using a passivation medium.

3. The micromechanical pressure sensor device as recited in claim 1, wherein the sensor substrate and the circuit substrate are at least partially enclosed by a mold housing, which includes a first through opening, which exposes the channel and the access openings.

4. The micromechanical pressure sensor device as recited in claim 1, wherein the sensor substrate and the circuit substrate are at least partially enclosed by a mold housing, which includes a first through opening, which exposes the access openings, and which includes a second through opening, which exposes the channel.

5. The micromechanical pressure sensor device as recited in claim 3, wherein a mounting flange is molded into the mold housing or is adhesively bonded onto the mold housing on a side of the mold housing facing away from the sensor substrate.

6. The micromechanical pressure sensor device as recited in claim 3, wherein the pressure sensor unit includes a third cavity, which is hermetically sealed and which adjoins a diaphragm area, on which or in which a piezoelectric unit is situated for detecting the pressure via a deformation of the diaphragm area.

7. The micromechanical pressure sensor device as recited in claim 3, wherein the pressure sensor unit is suspended via strip conductors in the sensor substrate.

8. A method for manufacturing a micromechanical pressure sensor device, comprising the following steps:

providing a sensor substrate having a front side and a rear side;

forming a pressure sensor unit suspended in the sensor substrate;

forming a first cavity above the pressure sensor unit, which is exposed via one or multiple access openings to the front side;

forming one or multiple stress relief trenches, which laterally enclose the pressure sensor unit and form a fluidic connection from the rear side to the first cavity;

bonding a circuit substrate including a strip conductor unit on the rear side of the sensor substrate, the strip conductor unit including a plurality of strip conductor levels and interposed insulation layers;

forming a second cavity below the pressure sensor unit in the circuit substrate in the strip conductor unit, the second cavity being in fluidic connection with the stress relief trenches;

forming at least one channel, in a periphery of the pressure sensor unit, which extends from the front side to the rear side and which is in fluidic connection with the second cavity.

9. The method as recited in claim 8, wherein the channel, the second cavity, the stress relief trenches, and the first cavity, are filled using a passivation medium.

* * * * *